(12) United States Patent
Ma et al.

(10) Patent No.: US 10,797,150 B2
(45) Date of Patent: Oct. 6, 2020

(54) DIFFERENTIAL WORK FUNCTION BETWEEN GATE STACK METALS TO REDUCE PARASITIC CAPACITANCE

(71) Applicant: Intel Corporation, Santa Clara, CA (US)

(72) Inventors: Sean T. Ma, Portland, OR (US); Willy Rachmady, Beaverton, OR (US); Matthew V. Metz, Portland, OR (US); Chandra S. Mohapatra, Beaverton, OR (US); Gilbert Dewey, Hillsboro, OR (US); Nadia M. Rahhal-Orabi, Lake Oswego, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/770,468

(22) PCT Filed: Dec. 17, 2015

(86) PCT No.: PCT/US2015/066478
§ 371 (c)(1),
(2) Date: Apr. 23, 2018

(87) PCT Pub. No.: WO2017/105469
PCT Pub. Date: Jun. 22, 2017

(65) Prior Publication Data
US 2018/0315827 A1  Nov. 1, 2018

(51) Int. Cl.
*H01L 29/00* (2006.01)
*H01L 29/49* (2006.01)
(Continued)

(52) U.S. Cl.
CPC .... *H01L 29/4966* (2013.01); *H01L 21/28264* (2013.01); *H01L 29/1054* (2013.01);
(Continued)

(58) Field of Classification Search
CPC .......... H01L 29/4966; H01L 21/28264; H01L 29/1054; H01L 29/205
See application file for complete search history.

(56) References Cited

U.S. PATENT DOCUMENTS

| | | |
|---|---|---|
| 2009/0032887 A1 | 2/2009 | Jang |
| 2009/0170267 A1 | 7/2009 | Shah et al. |

(Continued)

OTHER PUBLICATIONS

International Search Report and Written Opinion for International Patent Application No. PCT/US2015/066478 dated Aug. 19, 2016, 10 pgs.

(Continued)

*Primary Examiner* — Mounir S Amer
*Assistant Examiner* — Alexander Belousov
(74) *Attorney, Agent, or Firm* — Schwabe, Williamson & Wyatt, P.C.

(57) ABSTRACT

An apparatus including a non-planar body on a substrate, the body including a channel on a blocking material, and a gate stack on the body, the gate stack including a first gate electrode material including a first work function disposed on the channel material and a second gate electrode material including a second work function different from the first work function disposed on the channel material and on the blocking material. A method including forming a non-planar body on a substrate, the non-planar body including a channel on a blocking material, and forming a gate stack on the body, the gate stack including a first gate electrode material including a first work function disposed on the channel and a second gate electrode material including a second work function (Continued)

function different from the first work function disposed on the channel and on the blocking material.

16 Claims, 7 Drawing Sheets

(51) Int. Cl.
    *H01L 29/78*     (2006.01)
    *H01L 29/10*     (2006.01)
    *H01L 21/28*     (2006.01)
    *H01L 29/205*     (2006.01)
    *H01L 29/66*     (2006.01)

(52) U.S. Cl.
    CPC ...... *H01L 29/205* (2013.01); *H01L 29/66522* (2013.01); *H01L 29/66795* (2013.01); *H01L 29/78* (2013.01); *H01L 29/785* (2013.01); *H01L 29/7851* (2013.01)

(56) References Cited

U.S. PATENT DOCUMENTS

| | | | |
|---|---|---|---|
| 2012/0187871 A1* | 7/2012 | Fantz | H01J 61/12 315/358 |
| 2014/0332863 A1 | 11/2014 | Park et al. | |
| 2015/0041913 A1 | 2/2015 | An et al. | |
| 2015/0255545 A1 | 9/2015 | Holland | |

OTHER PUBLICATIONS

International Preliminary Report on Patentability for International Patent Application No. PCT/US2015/066478, dated Jun. 28, 2018, 7 pages.

Office Action from Taiwan Patent Application No. 105136484, dated Jun. 8, 2020, 18 pgs.

* cited by examiner

US 10,797,150 B2

DIFFERENTIAL WORK FUNCTION BETWEEN GATE STACK METALS TO REDUCE PARASITIC CAPACITANCE

CROSS-REFERENCE TO RELATED APPLICATION

This patent application is a U.S. National Phase Application under 35 U.S.C. § 371 of International Application No. PCT/US2015/066478, filed Dec. 17, 2015, entitled "DIFFERENTIAL WORK FUNCTION BETWEEN GATE STACK METALS TO REDUCE PARASITIC CAPACITANCE," which designates the United States of America, the entire disclosure of which is hereby incorporated by reference in its entirety and for all purposes.

BACKGROUND

Field

Integrated circuit devices.

Description of Related Art

Multigate transistors employing compound semiconductor materials such as group III-V compound semiconductors can use a narrow bandgap material (e.g., InGaAs) in a channel region to get high conductance at on-state, with a wide bandgap material (e.g., GaAs) in the subfin region to inhibit subfin leakage at off-state. One technique is to target a heretojunction of the narrow and wide bandgap materials to be inside the gate for subfin control. However, when the heterojunction is inside the gate, the gated portion of the wide bandgap material can turn on unintendedly at high gate bias, resulting in additional parasitic gate capacitance, increasing gate delay. In addition, the actual heterojunction location is subject to process variation. When the heterojunction ends up below the gate, the ungated portion of the narrow bandgap material cannot be turned off, giving rise to increased off-state leakage.

DETAILED DESCRIPTION

Techniques to minimize sub-channel parasitic leakage and gate-induced parasitic capacitance in transistor devices are described. In one embodiment, sub-channel parasitic leakage and gate-induced parasitic capacitance is minimized over current transistor design by self-aligning a heterojunction of semiconductor materials of different bandgaps to a gate of the transistor.

Figure 2:
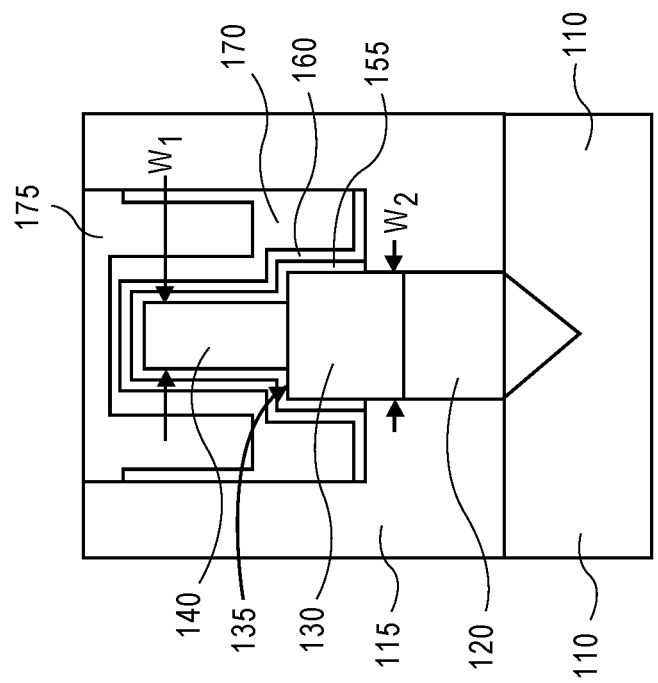
FIG. 2 shows the structure of FIG. 1 through line 2-2'.
Figure 1:
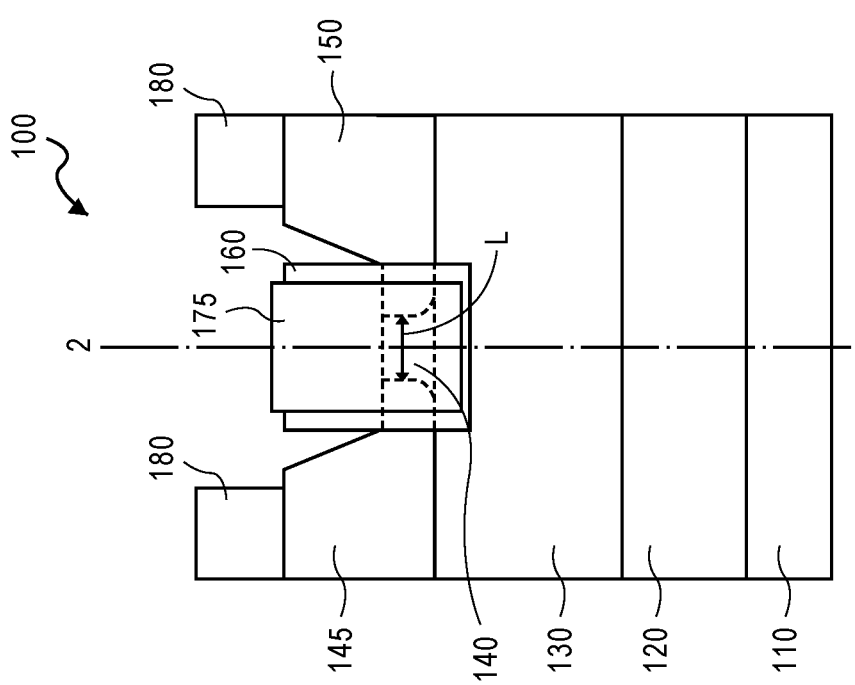
FIG. 1 shows a cross-sectional side view of a portion of a multigate field effect transistor device.

FIG. 1 shows a cross-sectional side view of an embodiment of a field effect transistor (FET) device such as a metal oxide semiconductor field effect transistor (MOSFET) device, a tunneling field effect transistor (TFET) device or other FET. FIG. 2 shows the structure of FIG. 1 through line 2-2'. Referring to FIG. 1 and FIG. 2, device 100 includes substrate 110 that is, for example, a single crystal silicon substrate. Disposed on substrate 110, in this embodiment, is buffer layer 120. Buffer layer 120 contains, for example, a material that has a larger lattice than a material of the substrate (e.g., silicon substrate 110). One suitable material in buffer layer is germanium. To reduce a threading dislocation density, a material such as germanium may be graded in buffer layer 120 to gradually increase a germanium composition in an epitaxially grown silicon germanium film such that closer to substrate 110, the germanium concentration is less and increases away from the substrate.

In the embodiment in FIG. 1 and FIG. 2, disposed on buffer layer 120 is blocking layer 130. In one embodiment, blocking layer 130 is a blocking material having a bandgap greater than a bandgap of silicon (a wide bandgap material). An example of a wide bandgap material is a material having a bandgap on the order of at least three electron volts (eV)). In another embodiment, blocking layer 130 is a material that has a lattice structure similar to a lattice of buffer layer 120 at the interface. For a buffer layer of primarily germanium at the interface (buffer layer 120), a suitable wide bandgap material for blocking 130 is gallium arsenide (GaAs).

As illustrated in FIG. 1, disposed on blocking layer 130 is junction region 145 and junction region 150. In one embodiment, junction region 145 is a source region of a MOSFET (e.g., an $n^+$ source) and junction region 150 is a drain region (e.g., $n^-$ drain). Disposed between junction regions 145 and 150 is channel 140 of a semiconductor material having a bandgap less than a bandgap of silicon (a narrow bandgap material). An example of a narrow bandgap material is a channel material of a group III-IV or group IV-V compound semiconductor material such as indium gallium arsenide (InGaAs). FIG. 1 shows channel 140 has length dimension, L of, for example, 10-30 nm.

As illustrated in FIG. 2, in one embodiment, channel 140 has a width dimension, $W_1$, that is less than a width dimension, $W_2$, of blocking layer 130 in a channel region. Representatively, channel 140 has a width dimension, $W_1$, on the order of 5-10 nm while blocking layer 130 has a width dimension, $W_2$, on the order of 10-20 nm. The difference in width dimensions between channel ($W_1$) and blocking layer 130 ($W_2$) creates shelf or ledge 135 in the channel region at a junction between the materials (a heterojunction). Shelf 135 has a surface (e.g., a horizontal surface as viewed in FIG. 2) of blocking material.

Overlying channel region 140 is oxidation layer 155 of, for example, silicon dioxide that is on the order of a few angstroms thick. Overlying oxidation layer 155 is gate dielectric layer 160 of, for example, a silicon dioxide or a dielectric material having a dielectric constant greater than silicon dioxide (a high k material) and a thickness on the order of a few nanometers. As illustrated, each of oxidation layer 155 and gate dielectric layer 160 are disposed on channel 140 and a portion of blocking layer 130 in a channel region. Specifically, oxidation layer 155 and gate dielectric layer 160 conform to the profile of channel 140 and blocking layer 130 along a length dimension of the channel including being disposed on shelf 135 and the opposing sidewalls of channel 140 and blocking layer 130. Disposed on gate dielectric 160, channel 140 and also conformally extending on blocking layer 130 in a channel region is gate electrode 170 of, for example, an electrically conductive material such as a metal material. In one embodiment, gate electrode 170 is disposed on shelf 135 and along a portion of opposing sidewalls in a length dimension of blocking layer 130 in a channel region of the structure. Disposed on gate electrode 170 on channel 140 is gate electrode 175 also of an electrically conducting material. As illustrated, gate electrode 175 is confined to channel 140 and is not disposed on sidewalls of blocking layer 130.

In one embodiment, a material for gate electrode 175 has a different work function than a material for gate electrode 170. For a MOSFET, a work function of a gate electrode material is related to a threshold voltage (the minimum gate to source voltage that is needed to create a conducting path between the source and drain). A lower work function gate metal (more n-type) gives a lower threshold voltage for a n-MOSFT. In one embodiment, a work function of a material for gate electrode 175 is less than a work function of a material for gate electrode 170. Representatively, decreasing a work function of the gate electrode lowers the threshold voltage of an n-MOSFET. Generally, a lower threshold voltage means less power consumption for a device but can also lead to increased off-state leakage. In one embodiment, a work function of gate electrode 175 sets the threshold voltage of channel 140. Similarly, a work function of gate electrode 170 which is disposed on blocking layer 130 sets the threshold voltage of that material.

In an embodiment where gate electrode 175 has a lower work function than a work function of gate electrode 170 and gate electrode 175 is confined to channel 140 while gate electrode 170 is on blocking layer 130, a differential work function scheme makes heterojunction 135, the junction between blocking layer 130 and channel 140, self-align with the gate. Such self-alignment reduces leakage through the channel at off-state because the channel is fully gated by gate electrode 175. Parasitic capacitance is also reduced at on-state because blocking layer 130 cannot be turned on due to higher work function of gate electrode 170 (higher than a work function gate electrode 175) which gates the blocking layer. In one embodiment, a target threshold voltage of a MOSFET device is on the order of 100 millivolts (mV) to 250 mV. A representative material for gate electrode 175 compatible with this threshold voltage target is titanium aluminum carbon (TiAlC). A material with a generally higher work function than TiAlC suitable for gate electrode 170 is titanium nitride (TiN).

A work function of an electrically conductive material can be related to a thickness of the material. In one embodiment, gate electrode 170 and gate electrode 175 are the same material (e.g., TiAlC) and are formed on structure 100 to have different thicknesses. In general, a thicker layer of TiAlC gives a lower work function (more n-type) and a lower threshold voltage for an n-MOSFET. In one embodiment, where gate electrode 170 and gate electrode 175 are the same material, gate electrode 170 has a thickness that is less than a thickness of gate electrode 175. For a material such as TiAlC, the result of a difference in thickness is that gate electrode 170 will have a work function that is greater than a work function of gate electrode 175. For representative purposes, in one embodiment, gate electrode 170 of TiAlC has a total thickness on the order of 5 nm, and gate electrode 175 of TiAlC has a total thickness on the order of 10 nm. Finally, FIG. 1 also shows metal contact 180 to junction region 145 and metal contact 185 to junction region 150. An additional contact may be formed to the gate stack to operate the device.

Figure 3:
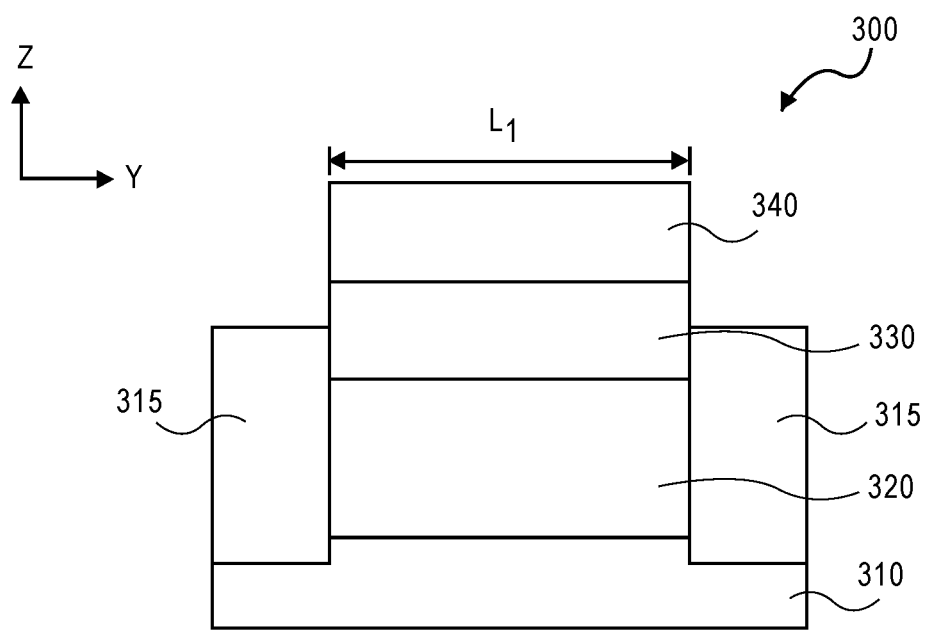
FIG. 3 shows a yz cross-sectional side view of a semiconductor substrate including a buffer layer, blocking layer and intrinsic layer thereon.

FIGS. 3-9 describe a process for forming the transistor structure illustrated in FIG. 1 and FIG. 2. FIGS. 3-9 thus describe one embodiment of forming a three-dimensional multi-gate transistor including a blocking layer beneath a channel with a first gate electrode material establishing a threshold voltage of the blocking layer and a second gate electrode material establishing a threshold voltage of the channel. Referring to FIG. 3, the figure shows a cross-sectional side view of a semiconductor substrate from a yz perspective. Substrate 310 includes any material that may serve as a foundation upon which a multi-gate transistor may be constructed. Representatively, substrate 310 is a portion of a larger substrate such as a wafer. In one embodiment, substrate 310 is a semiconductor material such as single crystal silicon. Substrate 310 may be a bulk substrate or, in another embodiment, is a semiconductor on insulator (SOI) structure.

In an embodiment involving non-lattice matched materials, bulk semiconductor substrates allow for implementation of high quality device layers. Disposed on a surface of substrate 310 in FIG. 3 is buffer layer 320. In one embodiment, buffer layer 320 includes a semiconductor material including a concentration of a semiconductor material such as germanium or a group III-V compound material compositionally graded through the layer. In an embodiment where buffer layer 320 includes germanium, a germanium concentration is increased from an interface of the layer with semiconductor substrate 310 toward an apex of the layer as viewed. In this manner, a substrate lattice constant is effectively tuned from silicon at the interface to that of germanium at an apex of layer 320. In one embodiment, buffer layer 320 including a graded concentration of germanium (e.g., silicon germanium buffer layer) may be epitaxially grown on substrate 310.

Overlying or disposed on buffer layer 320 in structure 300 shown in FIG. 3 is blocking layer 330 of a blocking material. In one embodiment, blocking layer 330 includes a material having a wide bandgap. A wide bandgap material, in one embodiment, is a material having a bandgap of at least 3 eV. Representative materials include group III-IV or group IV-V compound semiconductor materials. One suitable material for blocking layer 330 is a semiconductor material having a lattice structure similar to a lattice structure of buffer layer 320 at its interface with blocking layer 330. Where buffer layer 320 includes a high concentration of germanium at its apex, a wide bandgap semiconductor material for blocking layer 330 having a lattice structure similar to germanium is gallium arsenide (GaAs). In one embodiment, a material for blocking layer 330 has a suitable band offset to a material of a channel of a transistor device to be subsequently formed on blocking layer 330. A thickness of blocking layer 330 is representatively on the order of 10 nm to 100 nm. For a blocking layer of GaAs, the GaAs may be epitaxially grown.

Figure 5:
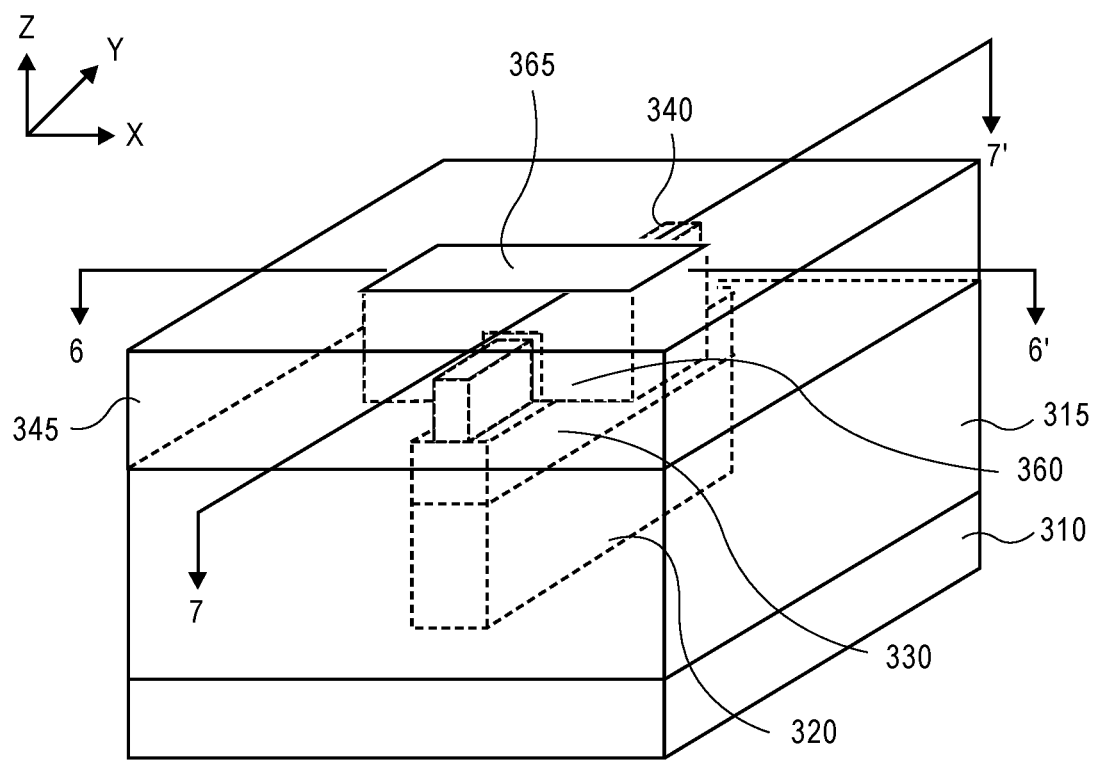
FIG. 5 shows a top side perspective view of the structure of FIG. 5 following the formation of a sacrificial gate stack on a fin portion of the intrinsic layer and blocking layer.

Overlying or disposed on blocking layer 330 in structure 300 of FIG. 5 is intrinsic layer 340. In one embodiment, intrinsic layer 340 is a narrow bandgap semiconductor material. A representative material for intrinsic layer 340 is a group III-IV or group IV-V compound semiconductor material. A representative material for intrinsic layer 340 is a narrow bandgap semiconductor material such as InGaAs. In one embodiment, intrinsic layer 340 of InGaAs may be epitaxially grown to a thickness on the order of 50 nm.

FIG. 3 shows structure 300 after formation of shallow trench isolation (STI) region 315 to define a device region in the structure. A suitable material for STI 315 is silicon dioxide. In one embodiment, an opening is etched through intrinsic layer 340, blocking layer 330, buffer layer 320 and into substrate 310 around a device structure area. The opening is then filled with dielectric material (e.g., by way of a deposition process) to define STI region. FIG. 3 illustrates structure 300 after portions of STI region 315 have been removed by, for example, an etch process to expose intrinsic layer 340 and a portion of blocking layer 330 and define a fin of intrinsic layer 340. A representative height of the exposed fin is representatively on the order of 500 angstroms (A). A representative length dimension, $L_1$ of the fin is on the order of 20 nm.

Figure 4:
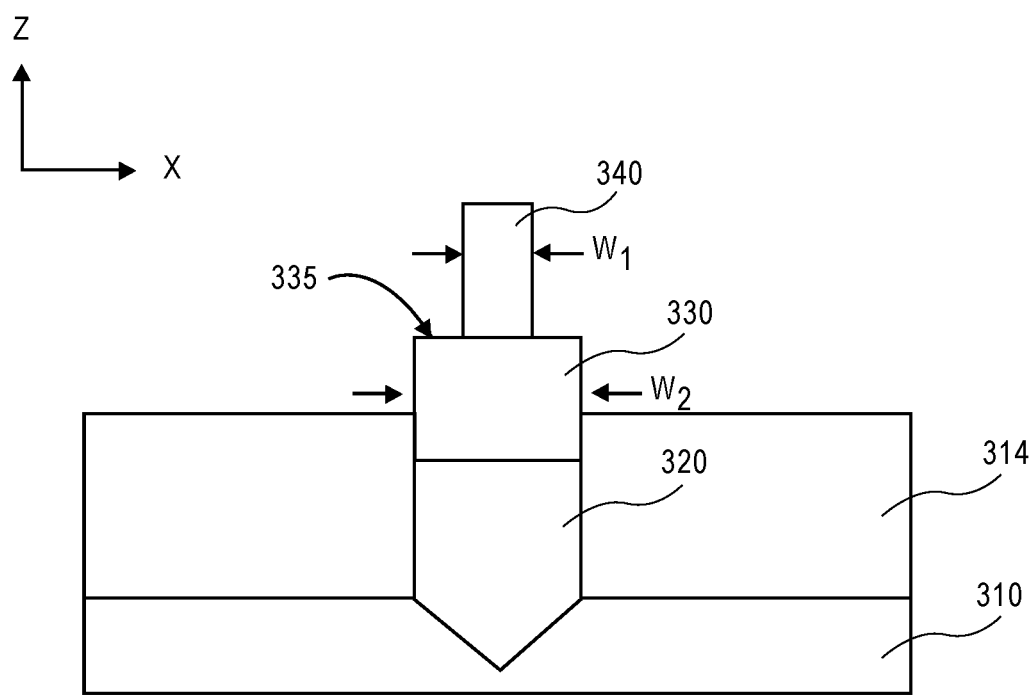
FIG. 4 shows the structure of FIG. 3 through an xz cross-section and shows the intrinsic layer having a width that is less than a width of the blocking layer.

FIG. 4 shows the structure of FIG. 3 from a xz perspective. FIG. 4 also shows the structure after the thinning of a width dimension of intrinsic layer 340 relative to a width dimension of blocking layer 330. In one embodiment, an intrinsic layer of InGaAs can be selectively thinned (width dimension reduced) relative to a blocking layer of GaAs by a wet etch of, for example, citric and peroxide mixture. FIG. 4 shows intrinsic layer 340 having a width, $W_1$, on the order of 10 nm which is less than a width, $W_2$, of blocking layer 330 (e.g., on the order of 20 nm). The reduced width of intrinsic layer 340 relative to a width of blocking layer creates a shelf or ledge at the junction of the materials (a heterojunction). FIG. 4 shows shelf 335 having a surface of blocking material.

FIG. 5 shows a top side perspective view of the structure of FIGS. 3 and 4 following the formation of a sacrificial or dummy gate stack on the fin portion of intrinsic layer 340 extending above STI region 315. In one embodiment, a gate stack includes gate dielectric layer 360 of, for example, silicon dioxide or a high k dielectric material. Disposed on gate dielectric layer 360, in one embodiment, is dummy gate 365 of, for example, polysilicon deposited by, for example, a chemical vapor deposition method. In one embodiment, to form the gate stack, a mask material is introduced over the structure and patterned to have an opening for the gate stack. The gate stack is then introduced. Following forming of the gate stack, the mask is removed and dielectric layer 345 of, for example, silicon dioxide is deposited on the structure to cover the fin.

Figure 6:
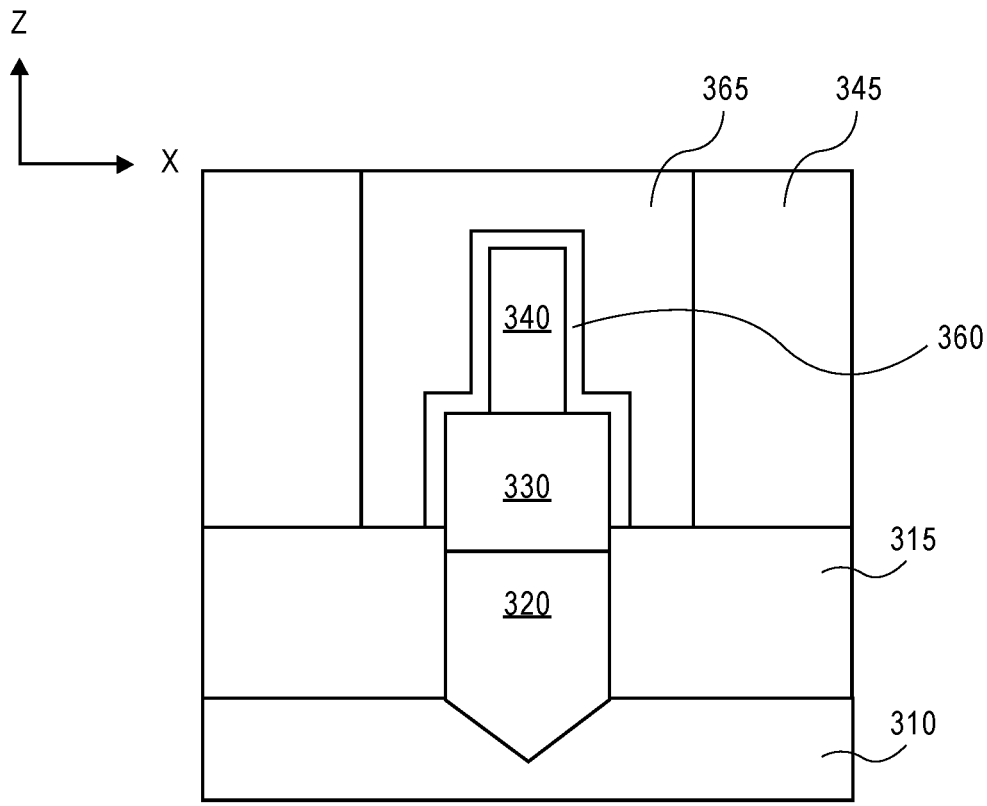
FIG. 6 shows the structure of FIG. 5 through line 6-6'.
Figure 7:
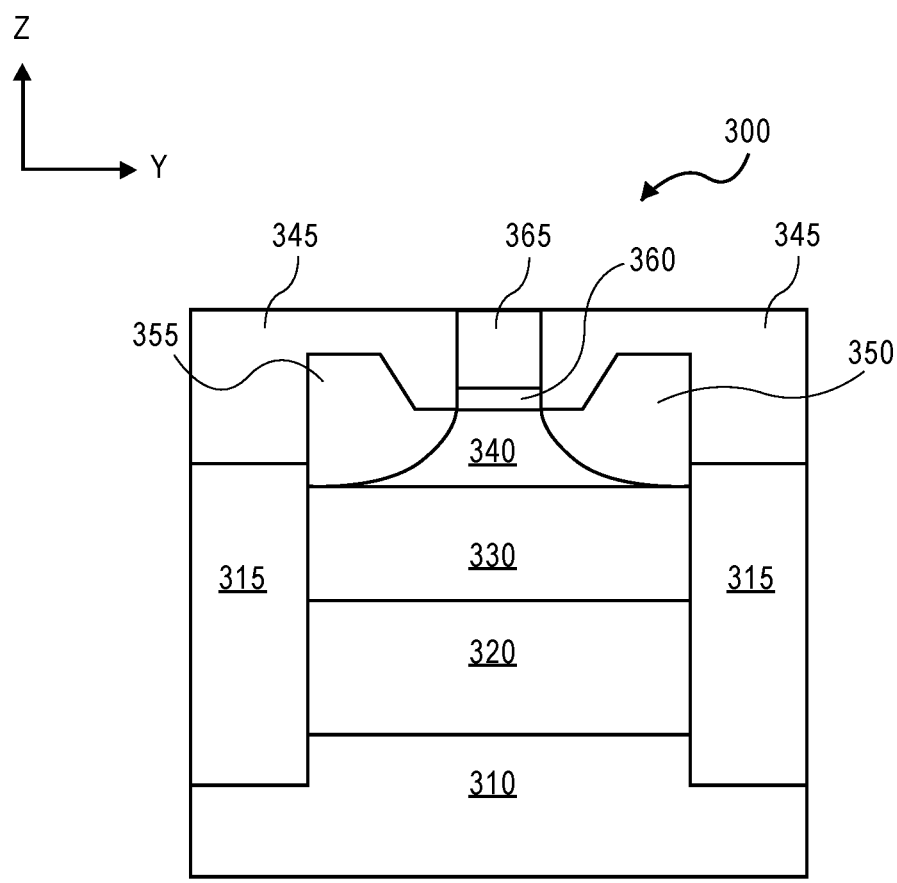
FIG. 7 shows a view of FIG. 5 through line 7-7' illustrating the structure after a formation of junctions in the fin.

FIG. 6 shows the structure of FIG. 5 through line 6-6' showing the gate stack of gate dielectric 360 and dummy gate 365 on the fin defined by intrinsic layer 340. FIG. 7 shows a view of FIG. 5 through line 7-7' illustrating junctions in the fin. Representatively, to form source and drain junctions, after the gate stack including gate dielectric 360 and dummy gate 365 are formed, junction regions of the fin are exposed in dielectric layer 345. Junctions 350 and 355 are then formed by removing portions of the fin material and replacing the removed fin material with source and drain material such as epitaxially grown silicon, silicon germanium, pure germanium, germanium tin, a group III-IV compound semiconductor or a group IV-V compound semiconductor to define a source and a drain, respectively for a MOSFET. A region of intrinsic layer 340 between junction 350 and junction 355 is the channel of a multigate transistor device. Once the junctions are formed, dielectric material is introduced over the junctions (illustrated in FIG. 7 as dielectric layer 345).

Figure 8:
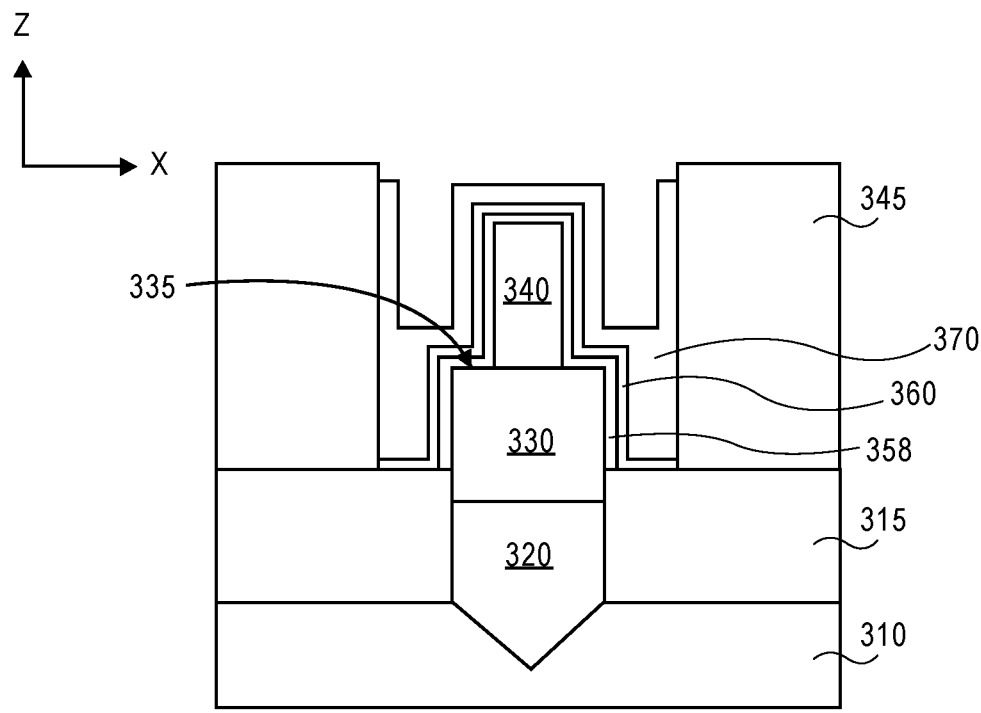
FIG. 8 shows the structure of FIG. 6 following a removal of the sacrificial gate and gate dielectric and introduction of a gate dielectric and first gate electrode material on the intrinsic layer and a portion of the blocking layer.

FIG. 8 shows the structure of FIG. 7 following the removal of the sacrificial gate and gate dielectric from the structure and the introduction of a gate stack. The sacrificial gate and gate dielectric may be removed by masking a top surface of the structure (as viewed) to expose the sacrificial gate and then etching the structure with an etchant or etchants to remove the sacrificial gate and gate dielectric. Once removed, an oxidation layer (oxidation layer 358) may be permitted to grow on the exposed intrinsic layer 340 and blocking layer 330 to a few angstroms. Gate dielectric layer 360 having a thickness on the order of a few nanometers is then introduced conformally on exposed intrinsic layer 340 and blocking layer 330. In one embodiment, gate dielectric layer 360 is a high K dielectric material such as hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof.

FIG. 8 shows first gate electrode material 370 conformally introduced on gate dielectric layer 360 on intrinsic layer 340 and blocking layer 330 by, for example, an atomic layer deposition process. The conformal deposition of first gate electrode material 370 deposits the material on intrinsic layer 340, on shelf 335 (at the heterojunction) and on blocking layer 330. The conformal deposition is deposited to a thickness to also fill the space between blocking layer 330 and a sidewall defined by dielectric layer 345 (e.g., representatively the space is equal to twice a thickness of first gate electrode material 370). A representative thickness of first gate electrode material 370 is 2.5 nm. It is appreciated that, in some instances, a thickness of first gate electrode material 370 will be determined by a targeted work function of the material.

Figure 9:
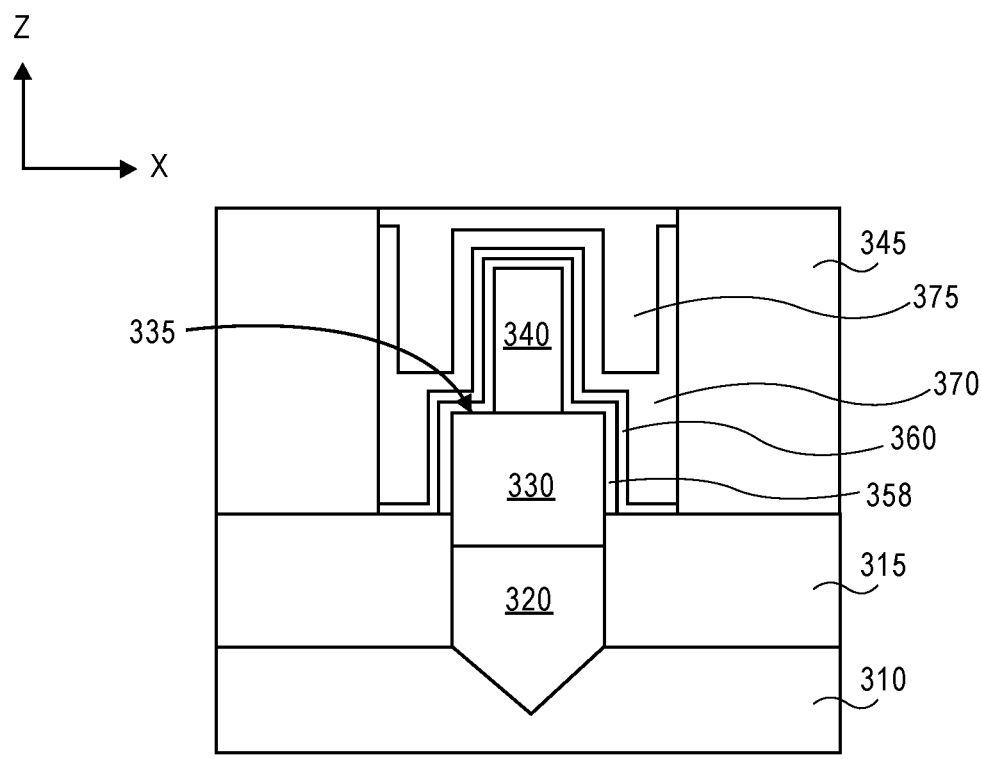
FIG. 9 shows the structure of FIG. 8 following the introduction of a second gate electrode material on the first gate electrode material.

FIG. 9 shows the structure of FIG. 8 following the introduction of a second gate electrode material as part of the gate stack. In one embodiment, second gate electrode material 375 is selected to have a work function different than a work function of the deposited first gate electrode material 370. Second gate electrode material 375 is conformally deposited, for example, by an atomic layer deposition process, on first gate electrode material 370 to fill the opening between the first gate electrode material 370 on intrinsic layer 340. As illustrated, second gate electrode 375 is confined to formation on intrinsic layer 340 (on the channel of the device). A representative thickness of second gate electrode material 375 is 5 nm. Similar to first gate electrode material 370, in some instances, a thickness of second gate electrode material 375 will be determined by a targeted work function of the material. In one embodiment, second gate electrode material 375 has a work function that is less than a work function of first gate electrode material 370. A representative material for first gate electrode material 370 is TiN and a representative material for second gate electrode 375 is TiAlC.

Following the formation of the gate stack, dielectric material may be introduced over the structure and then contacts introduced to the source, drain and gate stack, respectively and these contacts wired according to conventional processing.

Figure 10:
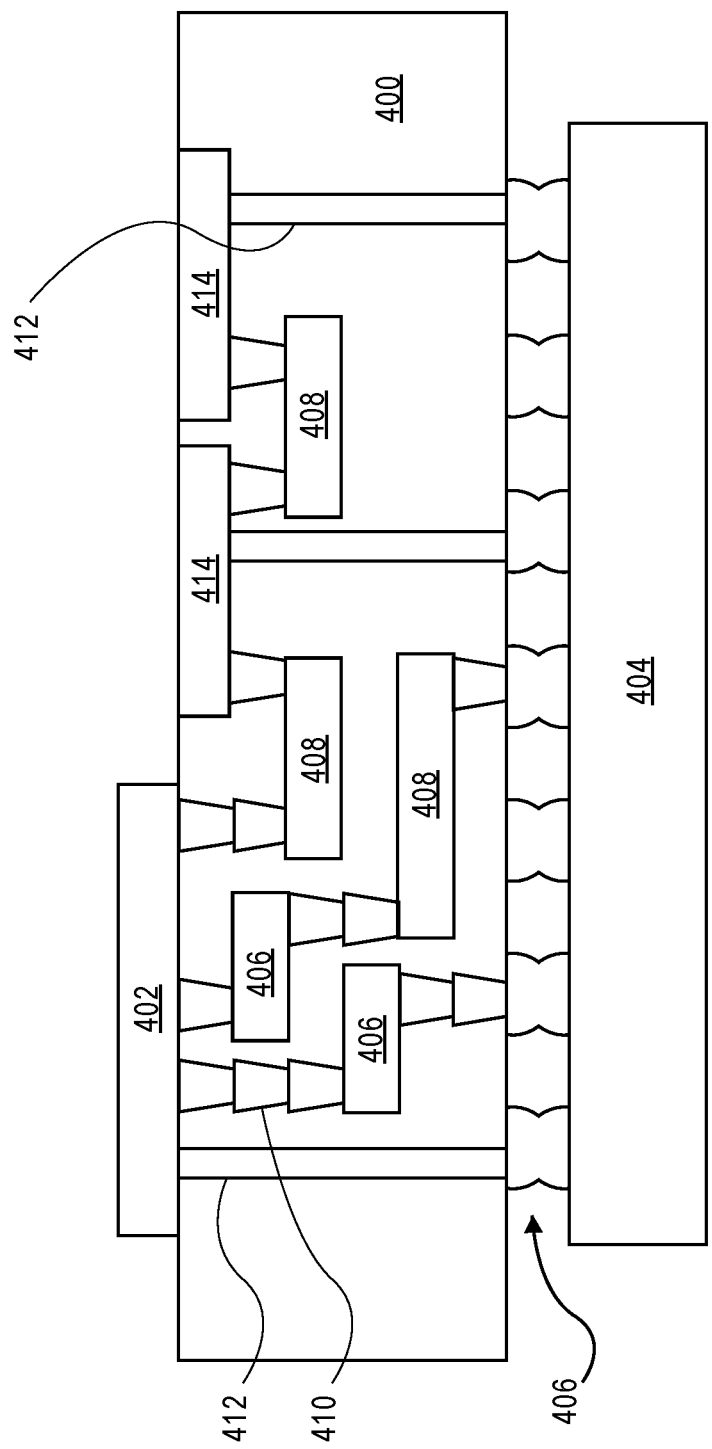
FIG. 10 is an interposer implementing one or more embodiments.

FIG. 10 illustrates interposer 400 that includes one or more embodiments. Interposer 400 is an intervening substrate used to bridge a first substrate 402 to second substrate 404. First substrate 402 may be, for instance, an integrated circuit die including multigate transistor devices of the type described above. Second substrate 404 may be, for instance, a memory module, a computer motherboard, or another integrated circuit die. Generally, the purpose of interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of interposer 400. In other embodiments, the first and second substrates 402/404 are attached to the same side of interposer 400. In further embodiments, three or more substrates are interconnected by way of interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 400.

Figure 11:
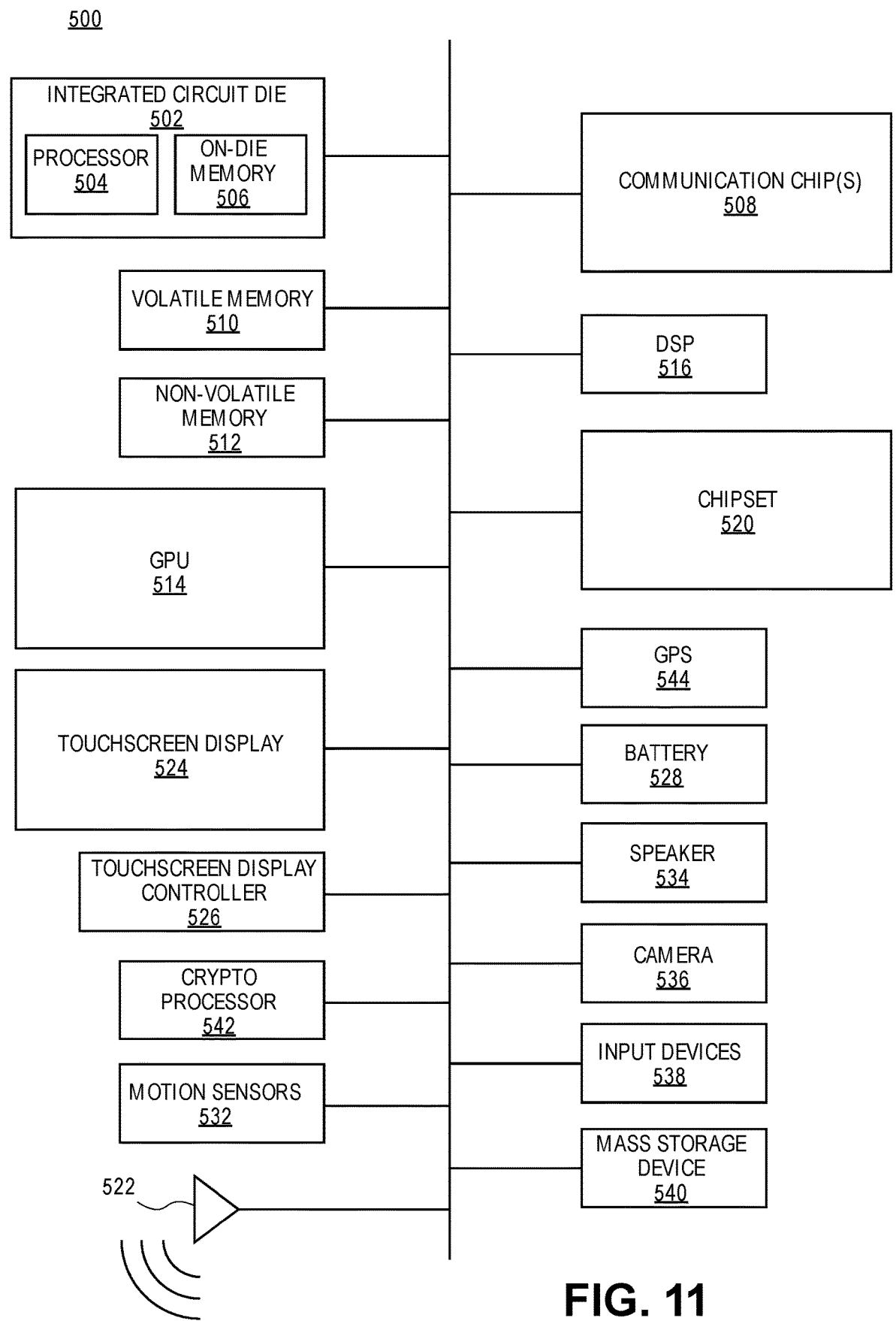
FIG. 11 illustrates an embodiment of a computing device.

FIG. 11 illustrates computing device 500 in accordance with one embodiment. Computing device 500 may include a number of components. In one embodiment, these components are attached to one or more motherboards. In an alternate embodiment, these components are fabricated onto a single system-on-a-chip (SoC) die rather than a motherboard. The components in computing device 500 include, but are not limited to, integrated circuit die 502 and at least one communication chip 508. In some implementations the communication chip 508 is fabricated as part of integrated circuit die 502. Integrated circuit die 502 may include CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), graphics processing unit 514 (GPU), digital signal processor 516, crypto processor 542 (a specialized processor that executes cryptographic algorithms within hardware), chipset 520, antenna 522, display or touchscreen display 524, touchscreen controller 526, battery 528 or other power source, a power amplifier (not shown), global positioning system (GPS) device 544, compass 530, motion coprocessor or sensors 532 (that may include an accelerometer, a gyroscope, and a compass), speaker 534, camera 536, user input devices 538 (such as a keyboard, mouse, stylus, and touchpad), and mass storage device 540 (such as hard disk drive, compact disk (CD), digital versatile disk (DVD), and so forth).

Communications chip 508 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 504 of computing device 500 includes one or more devices, such as multigate transistors, that are formed in accordance with embodiments described above. The term "processor" may refer to any device or portion of a device that processes electronic data from registers and/or memory to transform that electronic data into other electronic data that may be stored in registers and/or memory.

Communication chip 508 may also include one or more devices, such as transistors, that are formed in accordance with embodiments.

In further embodiments, another component housed within computing device 500 may contain one or more devices, such as multigate transistors, that are formed in accordance with implementations.

In various embodiments, computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

EXAMPLES

The following examples pertain to embodiments:

Example 1 is an apparatus including a non-planar body on a substrate, the non-planar body including an electrically conducting channel material on a blocking material, the channel material disposed between junction regions and including a band gap different from a band gap of the blocking material; and a gate stack on the body, the gate stack including a dielectric material and a first gate electrode material including a first work function disposed on the channel material and a second gate electrode material including a second work function different from the first work function disposed (1) on the channel material between the channel material and the first gate electrode material and (2) on the blocking material.

In Example 2, the work function of the first gate electrode materia of the apparatus of Example 1 is greater than the work function for the second gate electrode material.

In Example 3, the work function of the first gate electrode material of the apparatus of Example 1 is less than the work function for the second gate electrode material.

In Example 4, the first gate electrode material and the second gate electrode material of the apparatus of any of Examples 1-3 are the same material.

In Example 5, the second electrode material of the apparatus of Example 4 has a thickness that is less than the first gate electrode material.

In Example 6, the first gate electrode material and the second gate electrode material of the apparatus of any of Examples 1-3 include different materials.

In Example 7, the blocking material of the apparatus of any of Examples 1-6 includes a band gap greater than a band gap of silicon.

In Example 8, the blocking material of the apparatus of Example 7 includes a group III-V compound material.

In Example 9, the blocking material of the apparatus of Example 1 includes gallium arsenide.

In Example 10, the channel material of the apparatus of Example 1 includes indium gallium arsenide.

In Example 11, the channel material of the apparatus of any of Examples 1-6 includes a width dimension that is less than a width dimension of the blocking material such that a junction of the channel material and the blocking material defines a shelf on opposing sides of a length dimension of the body a superior surface of which includes the blocking material and wherein the second gate electrode is disposed on the shelf.

In Example 12, the second gate electrode of the apparatus of Example 11 is on the blocking material below the shelf.

Example 13 is an apparatus including a multi-gate transistor device including an electrically conducting channel material on a blocking material on a substrate, wherein the channel material includes a length dimension and a width dimension and the width dimension is less than a width dimension of the blocking material such that a junction of the channel material and the blocking material defines a shelf on opposing sides of a length dimension of the blocking material; a dielectric material disposed on the channel material and the blocking material; a first gate electrode material including a first work function disposed on the channel material and the dielectric material; and a second gate electrode material including a second work function different from the first work function disposed (1) on the channel material between the channel material and the first gate electrode material and (2) on the blocking material.

In Example 14, the work function of the first gate electrode material of the apparatus of Example 13 is greater than the work function for the second gate electrode material.

In Example 15, the work function of the first gate electrode material of the apparatus of Example 13 is less than the work function for the second gate electrode material.

In Example 16, the first gate electrode material and the second gate electrode material of the apparatus of any of Examples 13-15 are the same material.

In Example 17, the second electrode material of the apparatus of Example 16 has a thickness that is less than the first gate electrode material.

In Example 18, the first gate electrode material and the second gate electrode material of the apparatus of Example 13 include different materials.

In Example 19, the channel material of the apparatus of Example 13 includes indium gallium arsenide and the blocking material includes gallium arsenide.

Example 20 is a method including forming a non-planar body on a substrate, the non-planar body including an electrically conducting channel material on a blocking material, the channel material including a band gap different than a band gap of the blocking material; forming a source junction region and a drain junciton region in the body; and forming a gate stack on the body between the source junction region and the drain junction region, the gate stack including a dielectric material and a first gate electrode material including a first work function disposed on the channel material and a second gate electrode material including a second work function different from the first work function disposed (1) on the channel material between the channel material and the first gate electrode material and (2) on the blocking material.

In Example 21, forming the nonplanar body of the method of Example 20 includes reducing a width dimension of the channel material such that a junction of the channel material and the blocking material defines a shelf on opposing sides of a length dimension of the body a superior surface of which includes the blocking material and wherein forming the gate stack includes forming the second gate electrode on the shelf.

In Example 22, forming the gate stack of the method of Example 21 includes forming the second gate electrode on the blocking material below the superior surface.

In Example 23, forming the gate stack of the method of any of Examples 20-22 includes forming the first gate electrode material to have a work function greater than a work function for the second gate electrode material.

In Example 24, forming the gate stack of the method of any of Examples 20-22 includes forming the first gate electrode material to have a work function less than a work function for the second gate electrode material.

In Example 25, forming the gate stack of the method of any of Examples 20-22 includes forming the first gate electrode material and the second gate electrode material of the same material.

In Example 26, the second electrode material of the method of Example 25 is formed to a thickness that is less than a thickness of the first gate electrode material.

In Example 27, forming the gate stack of the method of any of Examples 20-22 includes forming the first gate electrode material and the second gate electrode material of different materials.

In Example 28, the channel material of the method of Example 20 includes indium gallium arsenide and the blocking material includes gallium arsenide.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
   a non-planar body on a substrate, the non-planar body comprising an electrically conducting channel material on a blocking material, the channel material disposed between junction regions and comprising a band gap different from a band gap of the blocking material, wherein the channel material has a top and sidewalls, and the blocking material has a top and sidewalls; and a gate stack on the body, the gate stack comprising a dielectric material and a first gate electrode material comprising a first work function and a second gate electrode material comprising a second work function different from the first work function, the second gate electrode material disposed (1) over the top and along the sidewalls of the channel material and between the channel material and the first gate electrode material and (2) along a portion of the sidewalls of the blocking material, wherein the first gate electrode material is over the top and along the sidewalls of the channel material but not along the sidewalls of the blocking material.

2. The apparatus of claim 1, wherein the work function of the first gate electrode material is greater than the work function for the second gate electrode material.

3. The apparatus of claim 1, wherein the work function of the first gate electrode material is less than the work function for the second gate electrode material.

4. The apparatus of claim 1, wherein the first gate electrode material and the second gate electrode material are the same material.

5. The apparatus of claim 4, wherein the second electrode material has a thickness that is less than the first gate electrode material.

6. The apparatus of claim 1, wherein the first gate electrode material and the second gate electrode material comprise different materials.

7. The apparatus of claim 1, wherein the blocking material comprises a band gap greater than a band gap of silicon.

8. The apparatus of claim 7, wherein the blocking material comprises a group III-V compound material.

9. The apparatus of claim 1, wherein the channel material comprises a width dimension that is less than a width dimension of the blocking material such that a junction of the channel material and the blocking material defines a shelf on opposing sides of a length dimension of the body a superior surface of which comprises the blocking material and wherein the second gate electrode is disposed on the shelf.

10. The apparatus of claim 9, wherein the second gate electrode is on the blocking material below the shelf.

11. An apparatus comprising:

a multi-gate transistor device comprising an electrically conducting channel material on a blocking material on a substrate, wherein the channel material has a top and sidewalls, and the blocking material has a top and sidewalls, wherein the channel material comprises a length dimension and a width dimension and the width dimension is less than a width dimension of the blocking material such that a junction of the channel material and the blocking material defines a shelf on opposing sides of a length dimension of the blocking material;

a dielectric material disposed on the channel material and the blocking material;

a first gate electrode material comprising a first work function disposed over the top and along the sidewalls of the channel material but not along the sidewalls of the blocking material; and a second gate electrode material comprising a second work function different from the first work function disposed (1) over the top and along the sidewalls of the channel material and between the channel material and the first gate electrode material and (2) along a portion of the sidewalls of the blocking material.

12. The apparatus of claim 11, wherein the work function of the first gate electrode material is greater than the work function for the second gate electrode material.

13. The apparatus of claim 11, wherein the work function of the first gate electrode material is less than the work function for the second gate electrode material.

14. The apparatus of claim 11, wherein the first gate electrode material and the second gate electrode material are the same material.

15. The apparatus of claim 14, wherein the second electrode material has a thickness that is less than the first gate electrode material.

16. The apparatus of claim 11, wherein the first gate electrode material and the second gate electrode material comprise different materials.

* * * * *